United States Patent
Rajwade et al.

(10) Patent No.: US 10,141,071 B2
(45) Date of Patent: Nov. 27, 2018

(54) PREDICTIVE COUNT FAIL BYTE (CFBYTE) FOR NON-VOLATILE MEMORY

(71) Applicant: Intel Corporation, Santa Clara, CA (US)

(72) Inventors: Shantanu R. Rajwade, Santa Clara, CA (US); Pranav Kalavade, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 37 days.

(21) Appl. No.: 14/998,119

(22) Filed: Dec. 26, 2015

(65) Prior Publication Data

US 2017/0186497 A1    Jun. 29, 2017

(51) Int. Cl.
| | |
|---|---|
| *G11C 29/38* | (2006.01) |
| *G11C 5/14* | (2006.01) |
| *G11C 29/44* | (2006.01) |

(52) U.S. Cl.
CPC .............. *G11C 29/38* (2013.01); *G11C 5/148* (2013.01); *G11C 29/44* (2013.01)

(58) Field of Classification Search
CPC .......... G11C 29/38; G11C 29/44; G11C 5/148
See application file for complete search history.

(56) References Cited

U.S. PATENT DOCUMENTS

| | | | |
|---|---|---|---|
| 7,137,050 B2 | 11/2006 | Merritt et al. | |
| 8,018,770 B2 | 9/2011 | Ha | |
| 8,077,532 B2 | 12/2011 | Manabe et al. | |
| 8,305,817 B2 | 11/2012 | Park et al. | |
| 2009/0083598 A1* | 3/2009 | Dixit | G01R 31/3187 714/733 |
| 2010/0061148 A1* | 3/2010 | Komatsu | G11C 11/5628 365/185.03 |
| 2011/0051523 A1 | 3/2011 | Manabe et al. | |

(Continued)

FOREIGN PATENT DOCUMENTS

| | | |
|---|---|---|
| TW | 201725506 A | 7/2014 |
| WO | 2014/088803 A1 | 6/2014 |
| WO | 2017/112022 A1 | 6/2017 |

OTHER PUBLICATIONS

International Search Report and Written Opinion received for International Patent Application No. PCT/US2016/055227, dated Dec. 29, 2016, 10 pages.

(Continued)

*Primary Examiner* — Thien Nguyen
(74) *Attorney, Agent, or Firm* — Spectrum IP Law Group LLC

(57) ABSTRACT

Methods and apparatus related to predictive Count Fail Byte (CFBYTE) for non-volatile memory are described. In one embodiment, logic determines a number of memory cells of the non-volatile memory that would pass or fail verification in a current program loop. The logic determines the number of the memory cells based at least in part on information from a previous program loop. The previous program loop is executed prior to the current program loop. The logic causes inhibition of one or more verification pulses to be issued in the current program loop based on comparison of the information from the previous program loop and a threshold value. Other embodiments are also disclosed and claimed.

20 Claims, 8 Drawing Sheets

(56) References Cited

U.S. PATENT DOCUMENTS

| | | | |
|---|---|---|---|
| 2011/0161571 A1* | 6/2011 | Kim | G11C 11/5628 |
| | | | 711/103 |
| 2011/0194346 A1* | 8/2011 | Yoon | G11C 16/3454 |
| | | | 365/185.03 |
| 2012/0092931 A1 | 4/2012 | Edahiro | |
| 2013/0094294 A1 | 4/2013 | Kwak et al. | |
| 2013/0208541 A1* | 8/2013 | Yoon | G11C 16/3454 |
| | | | 365/185.03 |
| 2014/0063968 A1 | 3/2014 | Shim et al. | |
| 2016/0217869 A1* | 7/2016 | Tseng | G11C 16/3459 |

OTHER PUBLICATIONS

Notice of Allowance received for U.S. Appl. No. 12/552,743, dated Aug. 9, 2011.

\* cited by examiner

| Loop # N | No of Bytes Below PV for Level N | Verify for Level N in This Loop? |
|---|---|---|
| 1 - 10 | 2000 | N |
| 11 | 1999 | Y |
| 12 | 1000 | Y |
| 13 | 400 | Y |
| 14 | 170 | Y |
| 15 | 55 | Y |
| 16 | 6 (CFBYTE criterion passed) | Y |
| 17 | 0 | N |
| 18+ | All cells in that level inhibited | |

*FIG. 3B*

| Loop # N | No of Bytes Below PV for Level N | Verify for Level N in This Loop? |
|---|---|---|
| 1 - 10 | 2000 | N |
| 11 | 1999 | Y |
| 12 | 1000 | Y |
| 13 | 400 | Y |
| 14 | 170 | Y |
| 15 | 55 (predictive CFBYTE passed) | Y |
| 16 | 6 | N |
| 17+ | All cells in that level inhibited | |

PREDICTIVE COUNT FAIL BYTE (CFBYTE) FOR NON-VOLATILE MEMORY

FIELD

The present disclosure generally relates to the field of electronics. More particularly, some embodiments generally relate to a predictive Count Fail Byte (CFBYTE) for Non-Volatile Memory (NVM).

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused. Moreover, new data is typically generated as volatile data first, before a user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like a solid state drive.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, or limit locations at which a device may be used.

Hard disk drives provide a relatively low-cost storage solution and are used in many computing devices to provide non-volatile storage. Disk drives, however, use a lot of power when compared with solid state drives since a hard disk drive needs to spin its disks at a relatively high speed and move disk heads relative to the spinning disks to read/write data. This physical movement generates heat and increases power consumption. Also, solid state drives are much faster at performing read and write operations when compared with hard drives. To this end, many computing segments are migrating towards solid state drives.

BRIEF DESCRIPTION OF THE DRAWINGS

The detailed description is provided with reference to the accompanying figures. In the figures, the left-most digit(s) of a reference number identifies the figure which the reference number first appears. The use of the same reference numbers in different figures indicates similar or identical items.

FIGS. 3B and 3C illustrate comparison tables indicating sample verification goals for various levels of a non-volatile memory, according to some embodiments.

DETAILED DESCRIPTION

Figure 1:
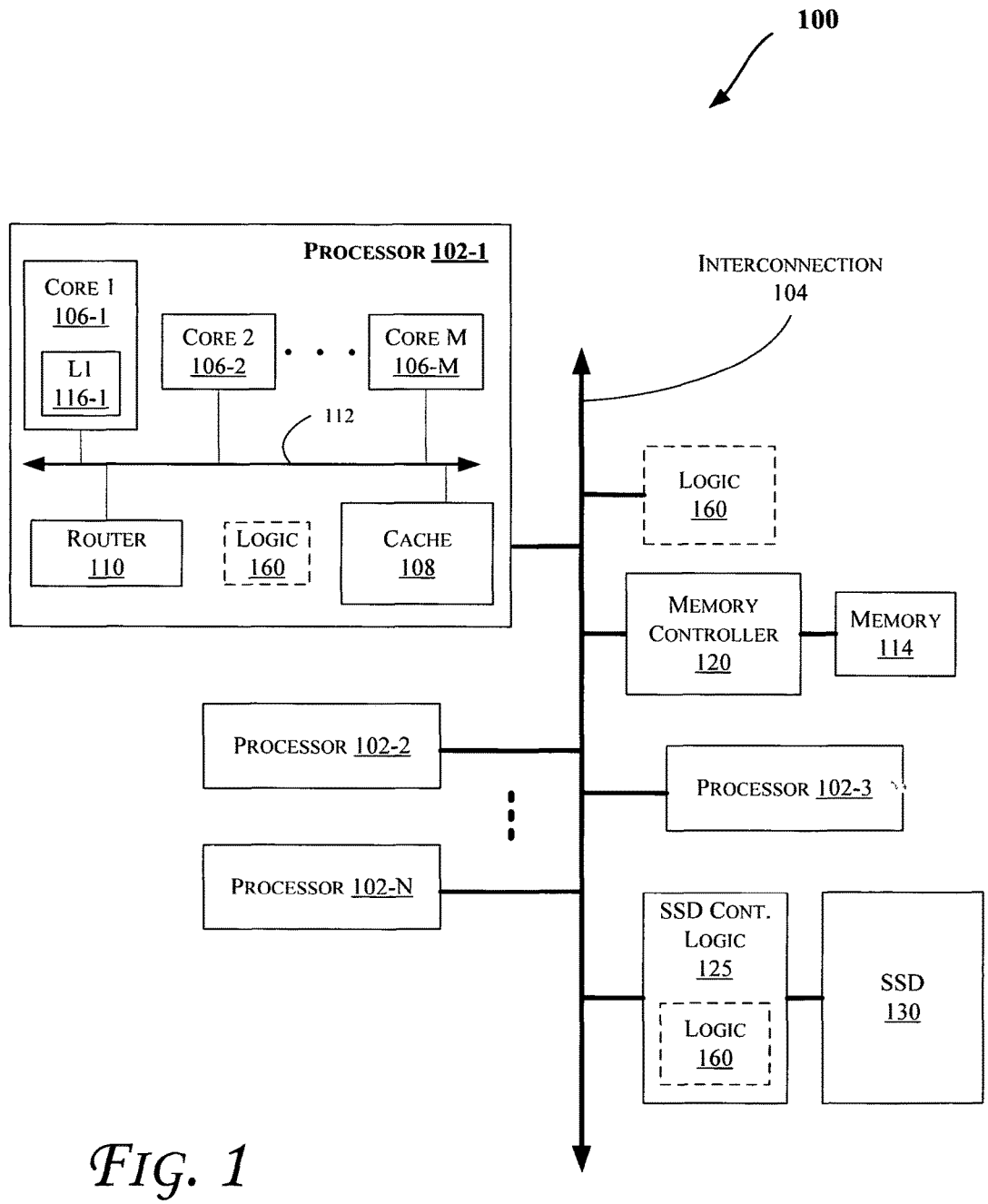
FIGS. 1 and 4-6 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, many computing segments are migrating towards NVM devices such as Solid State Drives (SSDs). During manufacture and/or operation of non-volatile memory cells (e.g., used in an SSD), the memory cells are tested for proper operation. Various pulses are sent to the memory cells to test whether the memory cells are capable of being written to and read from. The testing of the memory cells generally includes writing a threshold voltage to a memory cell and then reading the value stored in that cell during a verification operation. The verification ensures that a cell is capable of and attains its target voltage level.

As discussed herein, a program embodiment generally includes numerous (e.g., about ten to thirty, depending on number of levels) program loops to program cells or blocks of memory in an NVM device such as an SSD. The native cell threshold voltage of all cells in a page (which could be anywhere from 4 kilobytes or higher) often follows a normal distribution with an associated median and standard deviation (or sigma). A program loop is a combination of a program pulse followed by one or more verify pulses. The program pulse voltage may be stepped higher in every subsequent program loop to allow or assist slower to program cells to reach their respective target voltage levels. Cells reaching their respective target levels (determined during the verification pulses) are inhibited in all subsequent program pulses. This operation may continue until all cells in the page reach their target threshold voltage. However, most memories allow a certain small fraction of cells to be left behind, called as count fail byte (CFBYTE). This CFBYTE number is generally decided based on the error correction code (ECC) capability of the memory, and is often about 10 to 100 times lower than the ECC limit. As long as the total failing cells (for that level) are below the CFBYTE criterion, the failure to program these memory cells is allowed and they are further inhibited (from further programming) in all subsequent program pulses. Moreover, the memory controller may also stop issuing verify pulses for that level in all subsequent program loops.

Determining whether a particular level has passed/failed the CFBYTE criterion involves a counting process. This counting of number of cells occurs after every program loop and is often time consuming. Therefore, this process is usually run in parallel with the program pulse in the next program loop. If the number of failing cells is below a certain predetermined CFBYTE criterion, memory controller logic may stop issuing verify pulses for that level and inhibits these cells in all future program pulses.

Some embodiments relate to predictive CFBYTE implementations. More particularly, an embodiment predicts/anticipates the number of cells that would pass verification for a level in the current loop, based on the information from a previous program loop. If the number of cells failing verification for the previous loop are below the "predictive CFBYTE" criterion, the embodiment will not issue a verify pulse for that level in the current program loop, and may further inhibit those cells in subsequent program loops. One value proposition of such predictive approach is to save one last verify pulse that occurs on every level, which can provide about a five to 10 percent program performance improvement.

Furthermore, even though some embodiments are generally discussed with reference to Non-Volatile Memory (NVM), embodiments are not limited to a single type of NVM and non-volatile memory of any type or combinations of different NVM types (e.g., in a format such as a Solid State Drive (or SSD, e.g., including NAND and/or NOR type of memory cells) or other formats usable for storage such as a memory drive, flash drive, etc.) may be used. The storage media (whether used in SSD format or otherwise) can be any type of storage media including, for example, one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), or memory devices that use chalcogenide phase change material (e.g., chalcogenide glass). Also, any type of Random Access Memory (RAM) such as Dynamic RAM (DRAM), backed by a power reserve (such as a battery or capacitance) to retain the data, may be used. Volatile memory can include synchronous DRAM (SDRAM). Hence, even volatile memory capable of retaining data during power failure or power disruption may be used for storage in various embodiments.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-6. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIGS. 4-6), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes Non-Volatile (NV) storage (or Non-Volatile Memory (NVM)) device such as an SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 1, logic 125 can alternatively communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 2 and 4-6), etc.). Additionally, logic 125 may be incorporated into memory controller logic (such as those discussed with reference to FIGS. 4-6) or provided on a same Integrated Circuit (IC) device in various embodiments (e.g., on the same IC device as the SSD 130 or in the same enclosure as the SSD 130). System 100 may also include other types of non-volatile storage such as those discussed with reference to FIGS. 4-6, including for example a hard drive, etc.

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein such as those discussed with reference to other figures including 4-6, for example), including the cores 106, interconnections 104 or 112, components outside of the processor 102, SSD 130, SSD bus, SATA bus, logic 125, etc., to sense variations in various factors affecting power/thermal behavior of the system/platform, such as temperature, operating frequency, operating voltage, power consumption, power dissipation, current draw, stored voltage level, and so forth.

As illustrated in FIG. 1, system 100 may include logic 160, which can be located in various locations in system 100 (such as those locations shown, including coupled to interconnect 104, inside processor 102, etc.). As discussed herein, logic 160 facilitates operation(s) related to some embodiments such as determination and/or provision of a predictive CFBYTE value.

Figure 2:
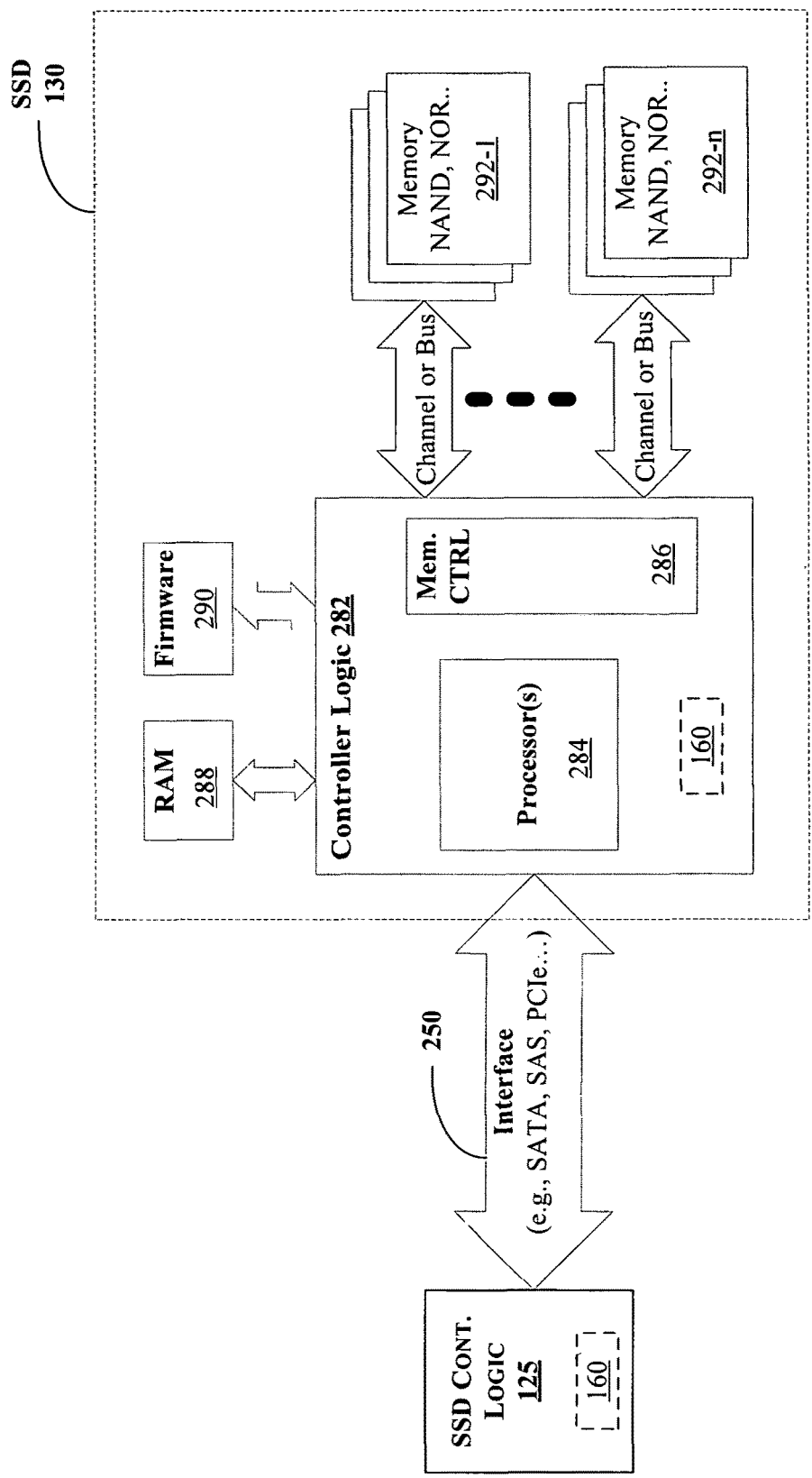
FIG. 2 illustrates a block diagram of various components of a solid state drive, according to an embodiment.

FIG. 2 illustrates a block diagram of various components of an SSD, according to an embodiment. Logic 160 may be located in various locations in system 100 of FIG. 1, as well as inside SSD controller logic 125, inside SSD 130, or one of SSD's components shown in FIG. 2. While SSD controller logic 125 may facilitate communication between the SSD 130 and other system components via an interface 250 (e.g., SATA, SAS, PCIe, etc.), a controller logic 282 facilitates communication between logic 125 and components inside the SSD 130 (or communication between components inside the SSD 130). As shown in FIG. 2, controller logic 282 includes one or more processor cores or processors 284 and memory controller logic 286, and is coupled to Random Access Memory (RAM) 288, firmware storage 290, and one or more memory modules or dies 292-1 to 292-n (which may include NAND flash, NOR flash, or other types of non-volatile memory). Memory modules 292-1 to 292-n are coupled to the memory controller logic 286 via one or more memory channels or busses. One or more of the operations discussed with reference to FIGS. 1-6 may be performed by one or more of the components of FIG. 2, e.g., processors 284 and/or controller 282 may compress/decompress (or otherwise cause compression/decompression) of data written to or read from memory modules 292-1 to 292-n. Also, one or more of the operations of FIGS. 1-6 may be programmed into the firmware 290. Furthermore, in some embodiments, a hybrid drive may be used instead of the SSD 130 (where a plurality of memory modules/media 292-1 to 292-n is present such as a hard disk drive, flash memory, or other types of non-volatile memory discussed herein). In embodiments using a hybrid drive, logic 160 may be present in the same enclosure as the hybrid drive.

Some embodiments reduce the number of verify pulses needed to place a level in single or multi-level NAND Flash memory by one. This is achieved by having the inhibit information of all cells going to a level cumulated over all the previous program pulses and predicting the number of cells that would pass in the current program pulse. If the number of failing cells (those that remain to be placed for a particular level) from the previous program loop are below the "predictive" criterion or threshold value, the embodiment continues to program these cells in the current program pulse but avoids issuing verify pulse for that level. This saves one verify operation/pulse per level, which can improve program performance by about five to ten percent in multi-level NAND memory.

Moreover, some implementations ensure that the number of cells failing verification for a particular level is below the CFBYTE criterion before stopping to issue verify pulses for that level (and inhibiting the failing cells in subsequent program loops). In some embodiments, by predicting the number of cells that would pass verification in the current program pulse, and if that would eventually qualify the CFBYTE goal, embodiments can avoid issuance of the verify pulse for that level in the current loop (which in effect would have been the last time this level was verified). This technique thereby saves one verify pulse per level, which amounts to about five to ten percent improvement in program performance.

Accordingly, to make the program embodiment efficient, not all levels receive a verify pulse in each program loop. In an embodiment, the embodiment (e.g., performed by logic 160) may be optimized to start issuing verify pulse(s) to any level when fastest to program cells are expected to pass verification in that loop. The embodiment may also stop issuing verify pulses for a level when the total number of cells failing to reach that level (e.g., slowest to program cells) are below a certain predetermined criterion (referred to as CFBYTE). Some embodiments save the last verification operation for every level.

Figure 3A:
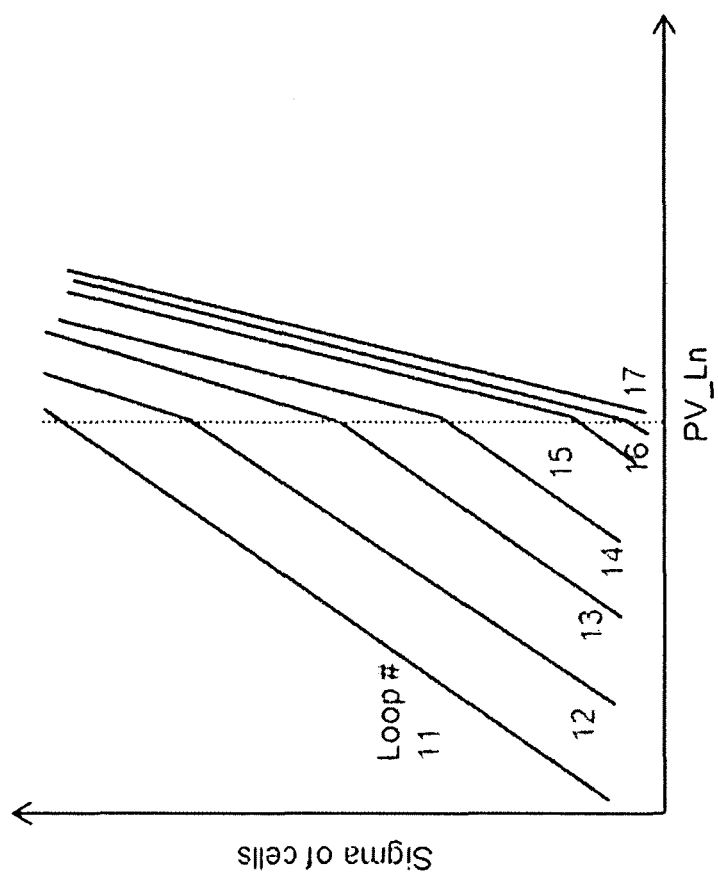
FIG. 3A illustrates a representative sample evolution of cell threshold voltage distribution values of a programmed level in a page for a Solid State Drive (SSD), according to some embodiments.

FIG. 3A illustrates a representative sample evolution of threshold voltage (VT) distribution for cells destined for a particular level in a single or multi-level cell page of an SSD up to a level "N" as a function of program loop count, according to some embodiments. FIGS. 3B and 3C illustrate comparison tables indicating sample verification goals for various levels of an NVM, according to some embodiments.

More particularly, the table of FIG. 3B shows a sample process on record program embodiment showing the loop numbers when level 'N' is verified. Number of cells failing verify for level "N" at the end of each loop (where this information is available at the beginning of the next loop, that is N+1) is also shown. As can be seen from this illustrative example, the total number of verifications required for level "N" are 6. By contrast, the table in FIG. 3C shows a proposed predictive CFBYTE program embodiment showing the loop numbers when level "N" is verified. Number of cells failing verify for level "N" at the end of each loop (where this information is available at the beginning of the next loop) is also shown. In the beginning of loop 16, CFBYTE evaluation of loop 15 reveals that the predictive CFBYTE criterion is met. It would be expected that after issuing the program pulse in loop 16, the number of cells failing the CFBYTE criterion would be about 6, which is the original allowable limit for the process on record. There is no need to verify level "N" in loop 16 as all the cells would be inhibited from loop 17 onwards anyways. As shown, the total number of verifications used for level "N" are 5 (or one less than FIG. 3B).

Moreover, considering an example in which cells (e.g., 2000 as shown in FIGS. 3B and 3C) are being placed to level "N" in multi-level programming embodiment. Referring to FIG. 3A, the fastest cell in the page would reach Program Verify (PV) voltage for level "N" in the 11th program loop. Verifying for level "N" prior to the 11th pulse can be unsuccessful, as all the cells would fail PV voltage. This may be avoided by setting the correct loop number at which the embodiment begins verifying for level "N", e.g., as seen in FIG. 3B. FIG. 3B also shows the total number of cells (for illustrative purposes only) that fail PV (where cell threshold voltage is lower than PV voltage) for level "N" after each program loop. The process of counting these failing cells is called CFBYTE evaluation. Since the pass/fail information for all levels being verified in loop "M" is available at the end of that loop, CFBYTE evaluation for program loop "M" occurs during (or just prior to) the program pulse in program loop "M+1".

For example, assuming that the CFBYTE criterion is 6 (i.e., we are allowed to leave behind less than or equal to six cells below PV voltage of level "N"), by the end of the 15th loop, 55 cells fail PV but this information is available at the beginning of the 16th loop. Similarly, by the end of the 16th loop, 6 cells fail PV criterion. Since, this information is available during the beginning of the 17th loop, the program embodiment quits verifying for level "N" in the 17th loop and inhibits all failing cells in future program loops (above 17). Accordingly, there is actually no need to verify for level "N" during the 16th program loop, if it is expected that the number of cells left behind after the 16th program pulse is less than or equal to the CFBYTE criterion for level "N".

In accordance with some embodiments, the proposed method can be applied as long as the cumulative distribution function (CDF) of the threshold voltage for all cells in the page (for example, 16 kilobytes or 16*1024*8=131,072 cells) is known. Threshold voltage is determined by numerous factors like cell geometry, doping concentration in the channel or other process parameters, which generally tend to be normal Gaussian distributions with associated median and standard deviation. Furthermore, with each subsequent program pulse (of higher program voltage), the shape of this threshold voltage CDF pertaining to cells failing the program verify remains unchanged, but laterally shifts on the threshold voltage axis depending on the program voltage step. In the particular example of the Gaussian distribution, with each subsequent program pulse, the distribution moves to higher threshold voltages while maintaining the same standard deviation. In summary, based on the CDF as well as the threshold voltage step, this embodiment can predict the number of cells that would fail PV after the current program loop, knowing the number of failing cells from the previous loop.

Moreover, if this predicted number is smaller than or equal to the CFBYTE criterion/threshold, logic 160 can cause stoppage of issuance of a verify pulse for level "N" in the current program loop. This is also shown in FIG. 3C. Namely, at the beginning of the 16th loop, CFBYTE evaluation for the 15th loop shows 55 cells failing PV. Calling this the "predictive CFBYTE" criterion/threshold, logic 160 can estimate that after the 16th program pulse, the number of cells failing PV would be 6 (which is the actual CFBYTE criterion). In this case, there is no need to issue a verify pulse for level "N" in the 16th loop because all the cells regardless of their pass/fail status would be inhibited from the 17th program loop. Hence, anticipating the number of cells that would fail verify in the current pulse based on the information of the previous pulse helps save the final verify pulse for every level, which can provide a program performance upside of about five to ten percent in multi-level cell programming. It should be noted that the predictive CFBYTE criterion (55 as discussed here) depends on the original CFBYTE criterion (6 as discussed here), the CDF of cell threshold voltages and the threshold voltage step with every subsequent loop.

However, irrespective of the shape of the threshold voltage CDF, the original CFBYTE criterion, and the program threshold voltage step, the proposed method can be deployed to save the last verify pulse for every programmed level of that page in various embodiments.

Additionally, the Raw Bit Error Rate (RBER) may be higher with some techniques discussed herein. But, this increase in RBER is expected to be significantly low compared to the end of life retention requirement, which is dominated by other failure mechanisms. In other words, the predictive criterion may be chosen such that the actual number of cells left behind are significantly lower than the predetermined Error Correcting Code (ECC) limit. Also, some adequate guard band may be allotted to the predictive CFBYTE criterion/threshold to account for cells which are slower (than expectation) to program. Not allocating sufficient guard band may result in larger than allowable number of cells failing to cross or reach the PV voltage for a given level and ultimately may cause RBER to be comparable/higher than the ECC limit.

Figure 3D:
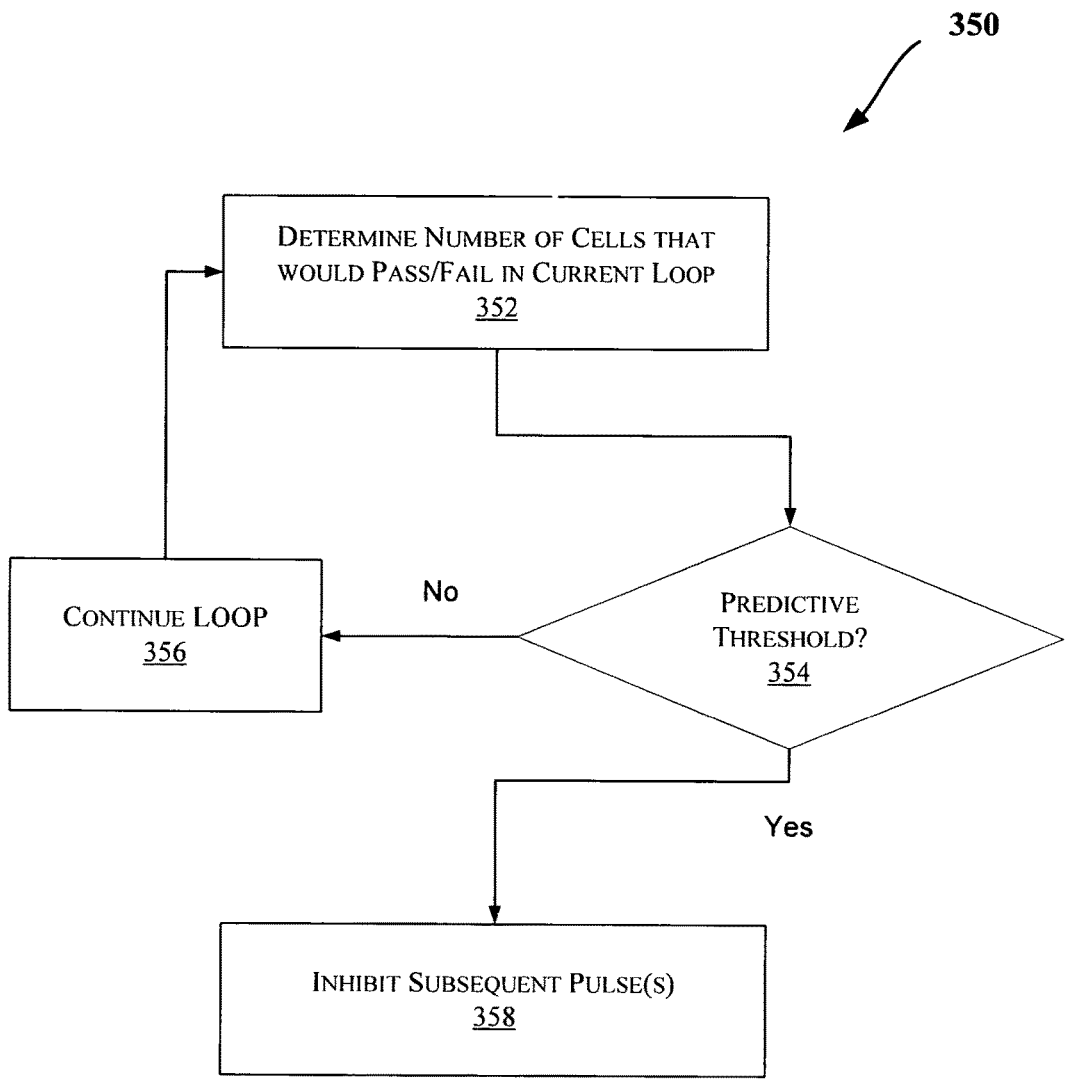
FIG. 3D illustrates a flow diagram of a method to utilize a predictive CFBYTE for non-volatile memory, according to an embodiment.

FIG. 3D illustrates a flow diagram of a method 350 to utilize a predictive CFBYTE, according to an embodiment. In an embodiment, various components discussed with reference to the other figures may be utilized to perform one or more of the operations of method 350. For example, logic 160 may be used to perform one or more operations of method 350.

Referring to FIGS. 1-3D, at operation 352, the number of memory cells of non-volatile memory that would pass or fail verification in a current program loop is determined. The determination of the number of the memory cells may be performed based at least in part on information from a previous program loop (where the previous program loop is executed prior to the current program loop).

At operation 354, it is determined whether a predictive threshold value (e.g., such as the predictive CFBYTE discussed with reference to the other figures herein). If the predictive threshold value has not been reached, then method 350 continues verification at operation 356 (e.g., for the current program loop). Otherwise, if the predictive threshold value is reached, operation 358 inhibits one or more subsequent program (e.g., verification) pulse(s) (e.g., for the current program loop and/or all subsequent program loops for the cells of operation 352) as discussed herein.

Figure 4:
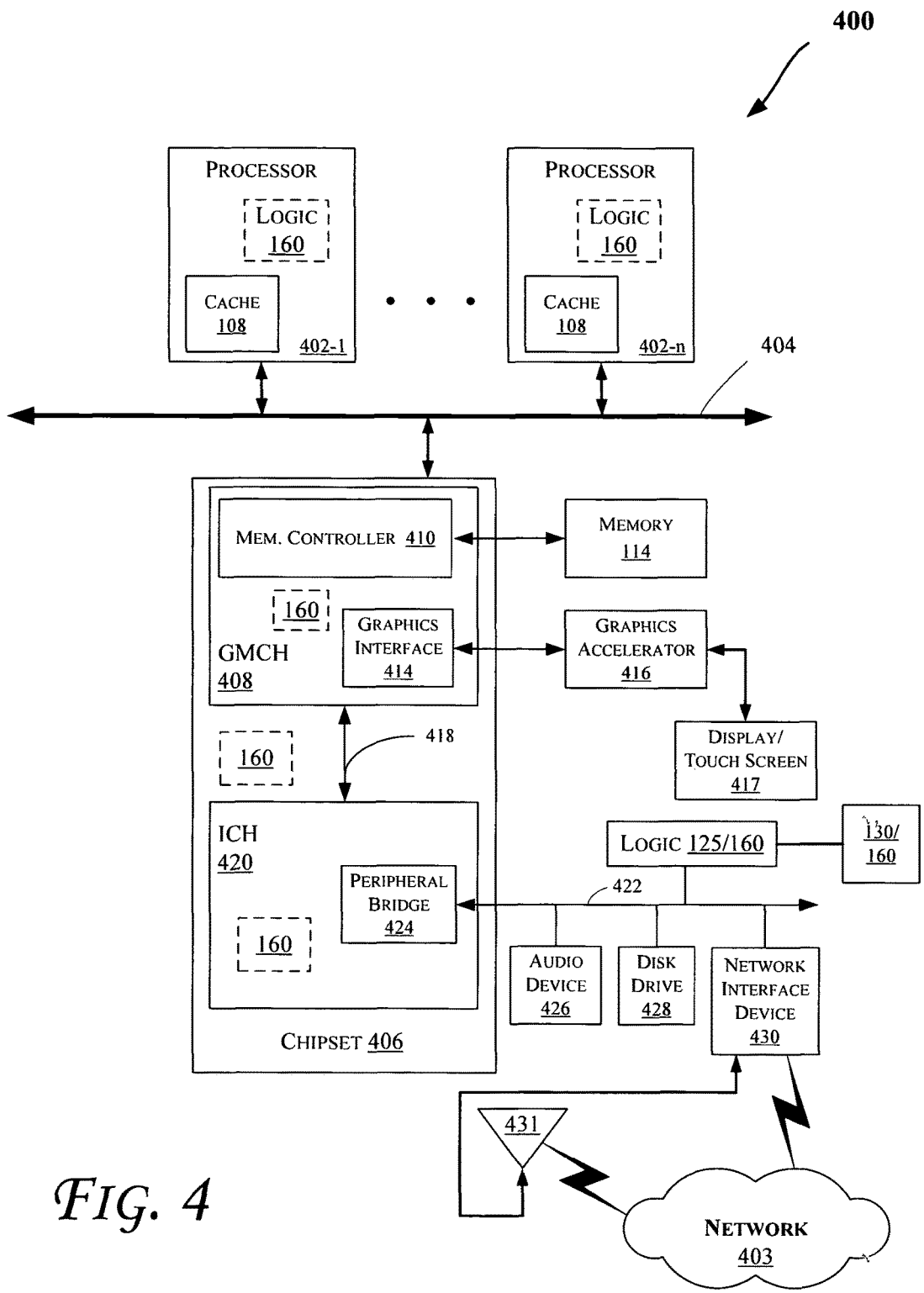

FIG. 4 illustrates a block diagram of a computing system 400 in accordance with an embodiment. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, including 3G (Third-Generation Cell-Phone Technology or 3rd Generation Wireless Format (UWCC)), 4G, Low Power Embedded (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or processor cache 108. Also, the operations discussed with reference to FIGS. 1-3D may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment) that communicates with the memory 114. The memory 114 may store data, including sequences of instructions that are executed by the CPU 402, or any other device included in the computing system 400. Also, system 400 includes logic 125, SSD 130, and/or logic 160 (which may be coupled to system 400 via bus 422 as illustrated, via other interconnects such as 404, where logic 125 is incorporated into chipset 406, etc. in various embodiments). In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk drive, flash, etc., including any NVM discussed herein. Additional devices may communicate via the interconnection network 404, such as multiple CPUs and/or multiple system memories.

The GMCH 408 may also include a graphics interface 414 that communicates with a graphics accelerator 416. In one embodiment, the graphics interface 414 may communicate with the graphics accelerator 416 via an accelerated graphics port (AGP) or Peripheral Component Interconnect (PCI) (or PCI express (PCIe) interface). In an embodiment, a display 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments, integrated drive electronics (IDE) or small computer system interface (SCSI) hard, drive(s), USB port(s), a, keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 403.

Other devices may communicate via the bus 422. Also, various components (such as the network interface device 430) may communicate with the GMCH 408 in some embodiments. In addition, the processor 402 and the GMCH 408 may be combined to form a single chip. Furthermore, the graphics accelerator 416 may be included within the GMCH 408 in other embodiments.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428); a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
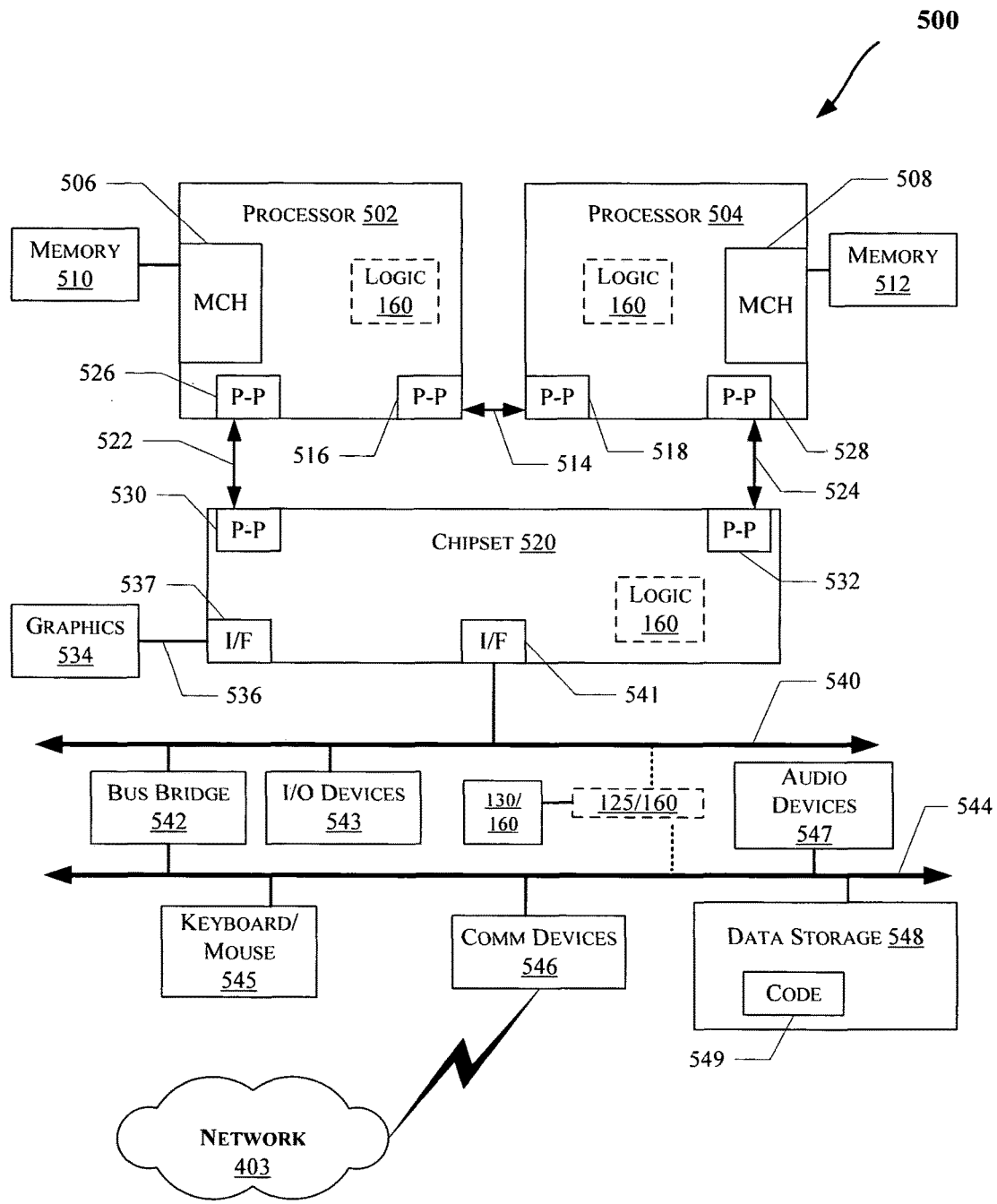

FIG. 5 illustrates a computing system 500 that is arranged in a point-to-point (PtP) configuration, according to an embodiment. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 in some embodiments. Furthermore, system 500 includes logic 125, SSD 130, and/or logic 160 (which may be coupled to system 500 via bus 540/544 such as illustrated, via other point-to-point connections to the processor(s) 502/504 or chipset 520, where logic 125 is incorporated into chipset 520, etc. in various embodiments).

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

In one embodiment, one or more of the cores 106 and/or processor cache 108 of FIG. 1 may be located within the processors 502 and 504 (not shown). Other embodiments, however, may exist in other circuits, logic units, or devices within the system 500 of FIG. 5. Furthermore, other embodiments may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

Figure 6:
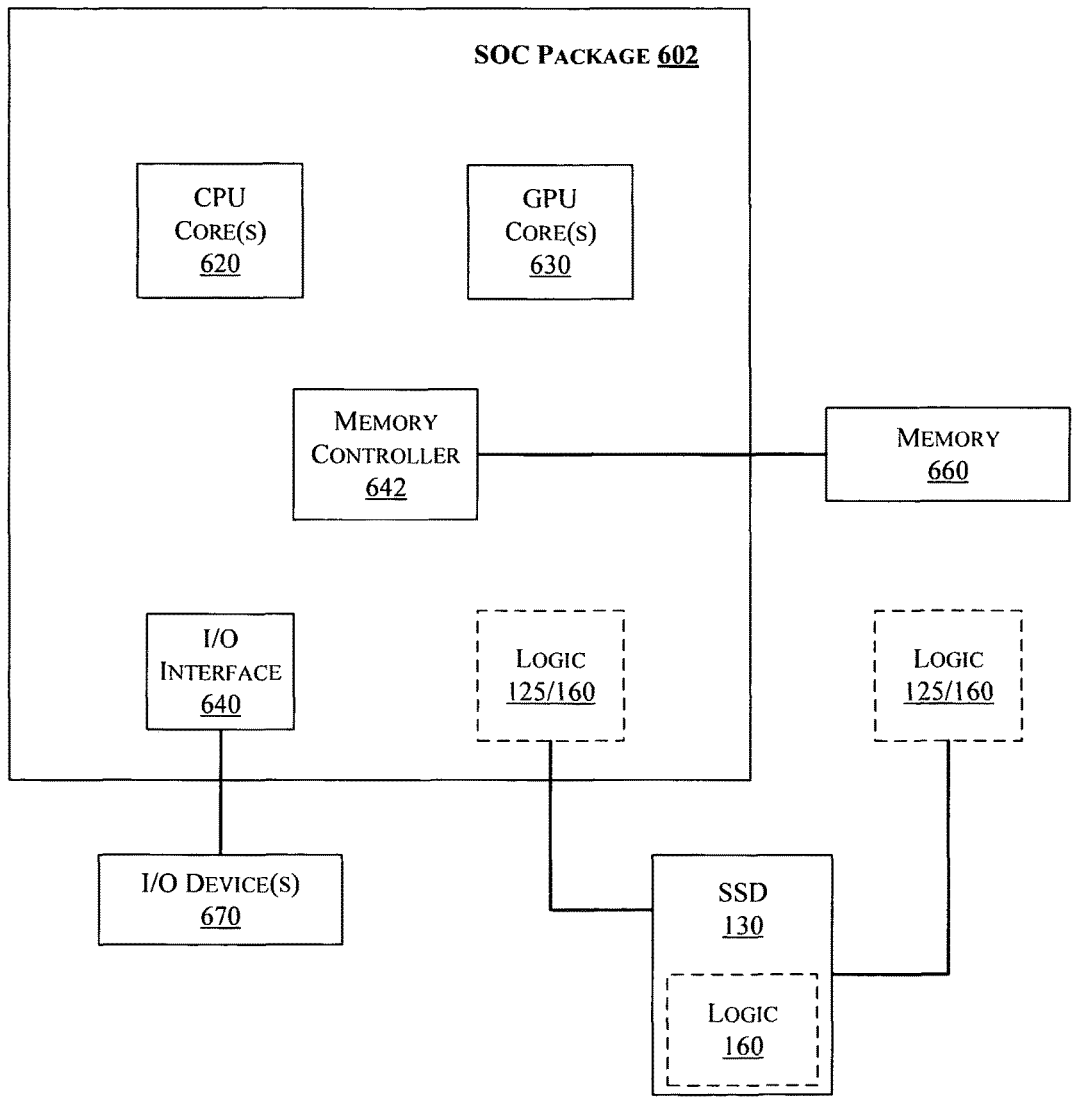

In some embodiments, one or more of the components discussed herein can be embodied as a System On Chip (SOC) device. FIG. 6 illustrates a block diagram of an SOC package in accordance with an embodiment. As illustrated in FIG. 6, SOC 602 includes one or more Central Processing Unit (CPU) cores 620, one or more Graphics Processor Unit (GPU) cores 630, an Input/Output (I/O) interface 640, and a memory controller 642. Various components of the SOC package 602 may be coupled to an interconnect or bus such as discussed herein with reference to the other figures. Also, the SOC package 602 may include more or less components, such as those discussed herein with reference to the other figures. Further, each component of the SOC package 620 may include one or more other components, e.g., as discussed with reference to the other figures herein. In one embodiment, SOC package 602 (and its components) is provided on one or more Integrated Circuit (IC) die, e.g., which are packaged onto a single semiconductor device.

As illustrated in FIG. 6, SOC package 602 is coupled to a memory 660 (which may be similar to or the same as memory discussed herein with reference to the other figures) via the memory controller 642. In an embodiment, the memory 660 (or a portion of it) can be integrated on the SOC package 602.

The I/O interface 640 may be coupled to one or more I/O devices 670, e.g., via an interconnect and/or bus such as discussed herein with reference to other figures. I/O device(s) 670 may include one or more of a keyboard, a mouse, a touchpad, a display, an image/video capture device (such as a camera or camcorder/video recorder), a touch screen, a speaker, or the like. Furthermore, SOC package 602 may include/integrate the logic 125/160 in an embodiment. Alternatively, the logic 125/160 may be provided outside of the SOC package 602 (i.e., as a discrete logic).

The following examples pertain to further embodiments. Example 1 includes an apparatus comprising: logic, coupled to non-volatile memory, to determine a number of memory cells of the non-volatile memory that would pass or fail verification in a current program loop, wherein the logic is to determine the number of the memory cells based at least in part on information from a previous program loop, wherein the previous program loop is to be executed prior to the current program loop, wherein the logic is to cause inhibition of one or more verification pulses to be issued in the current program loop based on comparison of the information from the previous program loop and a threshold value. Example 2 optionally includes the apparatus of example 1, wherein the threshold value is to comprise a predictive count fail byte (CFBYTE) value. Example 3 optionally includes the apparatus of example 1, wherein the threshold value is to correspond to an expected number of memory cells exceeding a threshold voltage value, the threshold value to be determined based on a cumulative distribution function (CDF) of threshold voltage values for all cells in a page of the non-volatile memory and a number of cells failing to meet a threshold voltage criterion from the previous program loop. Example 4 optionally includes the apparatus of example 3, wherein the cumulative distribution function is to comprise a Gaussian distribution function. Example 5 optionally includes the apparatus of example 1, wherein the threshold value in the current program loop is to be determined based on a cumulative distribution function (CDF) of threshold voltage values of all cells from the previous program loop. Example 6 optionally includes the apparatus of example 5, wherein the cumulative distribution function is to comprise a Gaussian distribution function. Example 7 optionally includes the apparatus of example 1, wherein the non-volatile memory is to comprise a multi-level non-volatile memory, wherein the logic is to determine the number of cells that have failed or passed verification for each level of the multi-level non-volatile memory based on information from a previous program loop. Example 8 optionally includes the apparatus of example 1, wherein a program loop is to comprise a program pulse followed by one or more verification pulses. Example 9 optionally includes the apparatus of example 1, wherein a program loop is to comprise a program pulse followed by one or more verification pulses, wherein a voltage level of each program pulse is to be stepped up for a subsequent program loop to assist a slower to program cell to reach its target voltage level. Example 10 optionally includes the apparatus of example 1, wherein a memory controller is to comprise the logic. Example 11 optionally includes the apparatus of example 1, wherein a solid state drive is to comprise one or more of: the non-volatile memory or the logic. Example 12 optionally includes the apparatus of example 1, wherein the non-volatile memory is to comprise one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), a memory device that uses chalcogenide phase change material, and volatile memory backed by a power reserve to retain data during power failure or power disruption. Example 13 optionally includes the apparatus of example 1, further comprising one or more network interfaces to communicate data to be stored in the non-volatile memory.

Example 14 includes a method comprising: determining a number of memory cells of non-volatile memory that would pass or fail verification in a current program loop, wherein the determining the number of the memory cells is performed based at least in part on information from a previous program loop, wherein the previous program loop is executed prior to the current program loop, wherein one or more verification pulses to be issued in the current program loop are inhibited based on comparison of the information from the previous program loop and a threshold value. Example 15 optionally includes the method of example 14, wherein the threshold value comprises a predictive count fail byte (CFBYTE) value. Example 16 optionally includes the method of example 14, wherein the threshold value corresponds to an expected number of memory cells exceeding a threshold voltage value, further comprising determining the threshold value based on a cumulative distribution function (CDF) of threshold voltage values for all cells in a page of the non-volatile memory and a number of cells failing to meet a threshold voltage criterion from the previous program loop. Example 17 optionally includes the method of example 14, further comprising determining the threshold value in the current program based on a cumulative distribution function (CDF) of threshold voltage values of all cells from the previous program loop. Example 18 optionally includes the method of example 17, wherein the cumulative distribution function comprises a Gaussian distribution function. Example 19 optionally includes the method of example 14, wherein the non-volatile memory comprises a multi-level non-volatile memory, further comprising determining the number of cells that have failed or passed verification for each level of the multi-level non-volatile memory based on information from a previous program loop. Example 20 optionally includes the method of example 14, wherein solid state drive comprises one or more of the non-volatile memory. Example 21 optionally includes the method of example 14, wherein the non-volatile memory comprises one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), a memory device that uses chalcogenide phase change material, and volatile memory backed by a power reserve to retain data during power failure or power disruption. Example 22 optionally includes the method of example 14, further comprising one or more network interfaces communicating data stored in the non-volatile memory.

Example 23 includes a computer-readable medium comprising one or more instructions that when executed on at least one a processor configure the at least one processor to perform one or more operations to: determine a number of memory cells of non-volatile memory that would pass or fail verification in a current program loop, wherein the determining the number of the memory cells is performed based at least in part on information from a previous program loop, wherein the previous program loop is executed prior to the current program loop, wherein one or more verification pulses to be issued in the current program loop are inhibited based on comparison of the information from the previous program loop and a threshold value. Example 24 optionally includes the computer-readable medium of example 23, wherein the threshold value comprises a predictive count fail byte (CFBYTE) value. Example 25 optionally includes the computer-readable medium of example 23, wherein the threshold value corresponds to an expected number of memory cells exceeding a threshold voltage value, the computer-readable medium further comprising one or more instructions that when executed on the at least one processor configure the at least one processor to perform one or more operations to cause determination of the threshold value based on a cumulative distribution function (CDF) of threshold voltage values for all cells in a page of the non-volatile memory and a number of cells failing to meet a threshold voltage criterion from the previous program loop.

Example 26 optionally includes a system comprising: a solid state drive comprising logic, coupled to non-volatile memory, to determine a number of memory cells of the non-volatile memory that would pass or fail verification in a current program loop; and one or more network interfaces to communicate data to be stored in the non-volatile memory, wherein the logic is to determine the number of the memory cells based at least in part on information from a previous program loop, wherein the previous program loop is to be executed prior to the current program loop, wherein the logic is to cause inhibition of one or more verification pulses to be issued in the current program loop based on comparison of the information from the previous program loop and a threshold value. Example 27 optionally includes the system of example 26, wherein the threshold value is to comprise a predictive count fail byte (CFBYTE) value. Example 28 optionally includes the system of example 26, wherein the threshold value is to correspond to an expected number of memory cells exceeding a threshold voltage value, the threshold value to be determined based on a cumulative distribution function (CDF) of threshold voltage values for all cells in a page of the non-volatile memory and a number of cells failing to meet a threshold voltage criterion from the previous program loop.

Example 29 includes an apparatus comprising means to perform a method as set forth in any preceding example. Example 30 comprises machine-readable storage including machine-readable instructions, when executed, to implement a method or realize an apparatus as set forth in any preceding example.

In various embodiments, the operations discussed herein, e.g., with reference to FIGS. 1-6, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-6.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
   logic circuitry, coupled to non-volatile memory of a solid state drive (SSD), the logic circuitry to determine a number of memory cells of the non-volatile memory that are allowed to fail program verification in a current program loop,
   wherein the logic circuitry is to determine the number of memory cells based at least on information from a previous program loop, wherein the information from the previous program loop includes a number of bytes below a program verify voltage for a level N of a multi-level programming of the non-volatile memory, wherein the previous program loop is to be executed prior to the current program loop, wherein the logic circuitry is to cause inhibition of one or more program verification pulses to be issued in the current program loop and any subsequent program loop based on a determination that the number of memory cells of the non-volatile memory has reached a threshold value, wherein the threshold value is lower than an Error Correction Code (ECC) limit of the non-volatile memory.

2. The apparatus of claim 1, wherein the threshold value is to comprise a predictive count fail byte (CFBYTE) value.

3. The apparatus of claim 1, wherein the threshold value corresponds to an expected number of memory cells exceeding a threshold voltage value, the threshold value to be determined based on a Gaussian distribution function.

4. The apparatus of claim 1, wherein the non-volatile memory is to comprise a multi-level non-volatile memory, wherein the logic circuitry is to determine the number of cells that have failed or passed program verification for each level of the multi-level non-volatile memory based on information from a previous program loop.

5. The apparatus of claim 1, wherein the current or previous program loops are each to comprise a program pulse followed by one or more program verification pulses.

6. The apparatus of claim 1, wherein the current or previous program loops are each to comprise a program pulse followed by one or more program verification pulses, wherein a voltage level of each program pulse is to be stepped up for a subsequent program loop to assist a slower to program cell to reach its target voltage level.

7. The apparatus of claim 1, wherein a memory controller is to comprise the logic circuitry.

8. The apparatus of claim 1, wherein the solid state drive is to comprise one or more of: the non-volatile memory or the logic circuitry.

9. The apparatus of claim 1, wherein the non-volatile memory is to comprise one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), a memory device that uses chalcogenide phase change material, and volatile memory backed by a power reserve to retain data during power failure or power disruption.

10. The apparatus of claim 1, further comprising one or more of: at least one network interface to communicate data to be stored in the non-volatile memory, a display, or a battery.

11. A method comprising:
  determining, at logic circuitry, a number of memory cells of non-volatile memory of a solid state drive (SSD) that are allowed to fail program verification in a current program loop,
  wherein determining the number of memory cells is performed based at least on information from a previous program loop, wherein the information from the previous program loop includes a number of bytes below a program verify voltage for a level N of a multi-level programming of the non-volatile memory, wherein the previous program loop is executed prior to the current program loop, wherein one or more program verification pulses to be issued in the current program loop and any subsequent program loop are inhibited based on a determination that the number of memory cells of the non-volatile memory has reached a threshold value.

12. The method of claim 11, wherein the threshold value comprises a predictive count fail byte (CFBYTE) value.

13. The method of claim 11, wherein the threshold value corresponds to an expected number of memory cells exceeding a threshold voltage value, further comprising determining the threshold value based on a Gaussian distribution function.

14. The method of claim 11, wherein the non-volatile memory comprises a multi-level non-volatile memory, further comprising determining the number of cells that have failed or passed program verification for each level of the multi-level non-volatile memory based on information from a previous program loop.

15. The method of claim 11, wherein the solid state drive comprises one or more of the non-volatile memory.

16. The method of claim 11, wherein the non-volatile memory comprises one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), a memory device that uses chalcogenide phase change material, and volatile memory backed by a power reserve to retain data during power failure or power disruption.

17. The method of claim 11, further comprising one or more network interfaces communicating data stored in the non-volatile memory.

18. At least one non-transitory computer-readable medium comprising one or more instructions that when executed on at least one a processor configure the at least one processor to perform one or more operations to:
  determine, at logic circuitry, a number of memory cells of non-volatile memory of a solid state drive (SSD) that are allowed to fail program verification in a current program loop,
  wherein determining the number of memory cells is performed based at least on information from a previous program loop, wherein the information from the previous program loop includes a number of bytes below a program verify voltage for a level N of a multi-level programming of the non-volatile memory, wherein the previous program loop is executed prior to the current program loop, wherein one or more program verification pulses to be issued in the current program loop and any subsequent program loop are inhibited based on a determination that the number of memory cells of the non-volatile memory has reached a threshold value.

19. The non-transitory computer-readable medium of claim 18, wherein the threshold value comprises a predictive count fail byte (CFBYTE) value.

20. The non-transitory computer-readable medium of claim 18, wherein the threshold value corresponds to an expected number of memory cells exceeding a threshold voltage value, the computer-readable medium further comprising one or more instructions that when executed on the at least one processor configure the at least one processor to perform one or more operations to cause determination of the threshold value based on a Gaussian distribution function.

\* \* \* \* \*